(12) United States Patent
Thoumy et al.

(10) Patent No.: US 6,996,170 B2
(45) Date of Patent: Feb. 7, 2006

(54) ADAPTIVE OPTIMIZATION METHODS, DEVICES AND APPLIANCES FOR THE TRANSMISSION OF CODED SIGNALS

(75) Inventors: François Thoumy, Vignoc (FR); Isabelle Amonou, Thorigne (FR)

(73) Assignee: Canon Kabushiki Kaisha, Tokyo (JP)

( * ) Notice: Subject to any disclaimer, the term of this patent is extended or adjusted under 35 U.S.C. 154(b) by 734 days.

(21) Appl. No.: 09/902,757

(22) Filed: Jul. 12, 2001

(65) Prior Publication Data

US 2002/0006175 A1 Jan. 17, 2002

(30) Foreign Application Priority Data

Jul. 13, 2000 (FR) .................................. 00 09230

(51) Int. Cl.
*H04B 1/66* (2006.01)

(52) U.S. Cl. ....................... 375/240; 375/340; 714/701; 714/758; 348/384; 348/420; 348/474

(58) Field of Classification Search ............... 375/240, 375/262, 265, 340, 341; 714/48, 701, 746, 714/751, 752, 758, 789, 762, 786, 788, 795; 348/384, 398, 420, 460, 473, 474; 382/232, 382/233, 238, 239, 240
See application file for complete search history.

(56) References Cited

U.S. PATENT DOCUMENTS

| | | | | |
|---|---|---|---|---|
| 5,608,458 A | * | 3/1997 | Chen et al. ............ | 375/240.14 |
| 5,761,248 A | | 6/1998 | Hagenauer et al. ....... | 375/340 |
| 5,825,430 A | * | 10/1998 | Adolph et al. ........... | 348/487 |
| 5,923,274 A | | 7/1999 | Fischer .................... | 341/94 |
| 6,215,422 B1 | | 4/2001 | Henry et al. ............ | 341/51 |
| 6,266,451 B1 | | 7/2001 | Charrier et al. ........ | 382/249 |
| 6,333,705 B1 | | 12/2001 | Amonou et al. ........ | 341/107 |
| 6,529,631 B1 | * | 3/2003 | Peterson et al. ........ | 382/232 |

FOREIGN PATENT DOCUMENTS

| EP | 0928116 A2 | 7/1999 |
|---|---|---|
| EP | 0973292 A2 | 1/2000 |

OTHER PUBLICATIONS

P.H. Westerink, et al., "Adaptive Channel Error Protection of Subband Encoded Images", IEEE Transactions on Communications, US, IEEE Inc. New York, vol. 41,No. 3, Mar. 1993, pp. 454-459.
U.S. Appl. No. 09/110,447, filed Jul. 7, 1998.
U.S. Appl. No. 09/138,646, filed Aug. 24, 1998.
U.S. Appl. No. 09/157,931, filed Sep. 22, 1998.
U.S. Appl. No. 09/539,700, filed Mar. 31, 2000.
U.S. Appl. No. 09/593,695, filed Jun. 15, 2000.
U.S. Appl. No. 09/237,247, filed Jan. 26, 1999.

(Continued)

*Primary Examiner*—Dac V. Ha
(74) *Attorney, Agent, or Firm*—Fitzpatrick, Cella, Harper & Scinto

(57) ABSTRACT

A method of transmitting blocks of data, in which, for at least one of the blocks of data, at least one parameter associated with this block of data is transmitted, the parameter representing the relative importance of the block of data associated with this parameter within the message transmitted by all the blocks of data. The data is coded by a channel coding method which does not take into account the parameter. Correlatively, the invention also concerns a decoding method associated with this transmission method. This way, data judged to be more important than other data may benefit from a channel decoding of higher quality. The methods described herein have application to devices and appliances implementing these methods.

23 Claims, 10 Drawing Sheets

OTHER PUBLICATIONS

U.S. Appl. No. 09/805,176, filed Mar. 14, 2001.
U.S. Appl. No. 09/785,780, filed Feb. 16, 2001.
Claude Berrou, et al., Near Shannon Limit Error—Correcting Coding And Decoding: Turbo-Codes (1); pp. 1064-1070.

Patrick Robertson; Illuminating The Structure Of Code And Decoder Of Parallel Concatenated Recursive Systematic (Turbo) Codes; Institute For Communications Technology German Aerospace Research Establishment (DLR); pp. 1298-1303.

* cited by examiner

| DS | IN |
|---|---|
| 1 | 16 |
| 2 | 8 |
| 3 | 4 |
| 4 | 2 |

FIG. 5a

| DS \ SNR | 0.5 dB | 0.7 dB | 1 dB |
|---|---|---|---|
| 1 | 20 | 16 | 12 |
| 2 | 12 | 8 | 8 |
| 3 | 8 | 4 | 4 |
| 4 | 4 | 2 | 2 |

FIG. 5b

ADAPTIVE OPTIMIZATION METHODS, DEVICES AND APPLIANCES FOR THE TRANSMISSION OF CODED SIGNALS

The present invention concerns communication systems which, in order to improve the fidelity of the transmission, the data to be transmitted are subjected to a channel coding.

It should be stated that the so-called "channel" coding consists of introducing a certain redundancy into the data to be transmitted. At the receiver, the associated decoding method then judiciously uses this redundancy for detecting any transmission errors and if possible correcting them.

Some of these decoding methods are "iterative". This type of decoding (parallel turbocode, block turbocode, serial convolutional code and so on) is characterised by the fact that the reliability of the decoded data (in the sense of their identity with the data before coding) increases with the number of iterations. It is therefore necessary to adjust this number of iterations so as to obtain sufficient transmission quality.

Various algorithms producing a criterion for stopping the iterative decoding can be proposed. The most simple use code words formed by adding to the data words a certain number of bits known to the decoder in advance; these additional bits serve as a reference for the decoder in order to determine how many iterations are necessary for correcting the transmission errors in accordance with the bit error rate aimed at.

So-called "adaptive" algorithms have also been proposed for determining the appropriate number of iterations, that is to say algorithms in which the number of iterations is determined dynamically by the reception device, according to an intrinsic estimation of the reliability of the data received. For example, the description of such an adaptive algorithm, based on the measurement of the entropy of the signals received, can be found in the article by M. MOHER entitled "Decoding via Cross-Entropy Minimisation", pages 809 to 813 of the transactions of "Globecom '93, IEEE Global Telecommunications Conference", vol. 2, Houston, Tex., USA (published by IEEE, Piscataway, N.J., USA, 1993); another adaptive algorithm, also based on measurements of entropy, is known from U.S. Pat. No. 5,761,248. Yet another example of an adaptive algorithm, based in this case on a measurement of the noise variance, is described in the article by P. ROBERTSON entitled "Illuminating the Structure of Coder and Decoder for Parallel Concatenated Recursive Systematic (Turbo) Codes" presented at "Globecom '94" (published by IEEE, Piscataway, N.J., USA, 1994). These "adaptive" algorithms thus make it possible to dispense with the transmission of additional bits independent of the data, but at the cost of appreciably increased complexity.

However, all the conventional algorithms have in common the fact that they take no account of the fact that, in many practical situations, the data transmitted do not all, burst after burst, have the same importance with regard to their impact on the clarity of the message. These conventional coding/decoding methods therefore use a larger number of iterations than necessary with regard to the data of lesser importance, for which it is possible to tolerate an error rate greater than the maximum rate tolerable for the more important data.

In order to remedy this drawback, the present invention proposes a novel transmission and decoding algorithm, which can be designated as an "adaptive on transmission" algorithm, in contradistinction to "adaptive on reception" decoding algorithms which, as has been seen, determine the desirable number of iterations by examining the received signal.

This is because the present invention concerns, according to a first of its aspects, on the one hand, a method of transmitting blocks of data which have been coded by means of a channel coding method compatible with an iterative decoding, said method being remarkable in that, for at least one of said blocks of data, at least one parameter associated with this block of data is transmitted, said parameter indicating the minimum number of iterations to be applied by an iterative coder during the decoding of the block of data associated with this parameter.

In addition, according to this first aspect of the invention, the latter concerns, correlatively, a method of decoding blocks of data which have been coded by means of a channel coding method compatible with an iterative decoding, said method being remarkable in that, a signal containing at least one parameter associated with a block of data having been transmitted for at least one of these blocks of data, said parameter is extracted from the signal containing it, and said parameter is used as an indicator of the minimum number of iterations applied by the iterative decoder to the block of data associated with its parameter.

Thus the methods according to the invention make it possible to choose the desirable number of iterations of the decoder according, amongst other things (or exclusively), to the nature of the signal before it is transmitted.

It is possible to imagine various criteria leading to the choice of the desirable number of iterations for each block of data transmitted. For example, a very simple criterion consists of choosing a minimum number of iterations which is invariable for all the blocks of data forming part of the same message, if it is considered that this number of iterations will always be sufficient, having regard to the signal to noise ratio of the channel, in order to ensure an acceptable rate. However, the invention proves to be particularly advantageous in the case where there is a certain hierarchy with regard to the reliability required for the transmission of these blocks of data, this concept of decoding quality which is tuneable according to some given hierarchy between the data to be transmitted being also applicable to types of decoding other than iterative decoding.

A transmission method which takes into account such a hierarchy can be found in EP-0 926 116 (based on JP-36883997). According to this method, channel coding is realized by means of a unit which adds parity bits to the data, the number of these parity bits being a function of the relative importance of these data, so that the parameters of the coding as well as the parameters of the decoding depend on the data hierarchy. Thus, the parameters of the channel coding method used are made to vary within the same message. Because of this, implementing the transmission method according to EP-0 926 116 is fairly cumbersome.

According therefore to a second aspect of the present invention, the matter concerns, on the one hand, a method of transmitting blocks of data, in which, for at least one of said blocks of data, at least one parameter associated with this block of data is transmitted, said parameter representing the relative importance of the block of data associated with this parameter within the message transmitted by all the blocks of data, characterised in that the data are coded by means of a channel coding method which does not take into account said parameter.

Moreover, according to this second aspect of the invention, the latter concerns, correlatively, a method of decoding blocks of data, for which a signal containing at least one parameter associated with at least one of these blocks of data has been transmitted, said parameter representing the relative importance of the block of data associated with this parameter within the message transmitted by all the blocks of data, characterised in that the data have been coded by means of a channel coding method which does not take into account said parameter, and in that said parameter is extracted from the signal containing it, and said parameter is used as a guide for the decoder so that data judged to be more important than others may benefit from a channel decoding of higher quality.

Thus, the methods according to the invention, besides being easy to implement, make it possible to achieve "intelligent" savings, that is to say in direct relationship with the nature of the data to be transmitted, in terms of processing time and costs, which the known methods have not made it possible to achieve up to the present time.

According to a particularly advantageous embodiment of this second aspect of the invention, the blocks of data are transmitted in order of decreasing importance and, where the parameter associated with a block of data newly received has not been able to decoded correctly, a parameter identical to the one associated with the previous block of data will be allocated to this new block of data.

Thus it will be possible to guarantee the quality of the decoding even if parameters are occasionally made indecipherable consequent upon transmission faults.

According to requirements, said parameters according to the first or second aspect of the invention can be either transmitted over the same channel as the associated data or transmitted over a separate channel.

Where the parameters according to the second aspect of the invention are transmitted over the same channel as the associated data, provision can advantageously be made, for said transmission, for a signal consisting of bursts of bits to be transmitted, each burst containing on the one hand one or more blocks of data either complete or fragmented over several successive bursts, and on the other hand the parameter associated with the most important data appearing in the following burst.

Thus the decoder receiving a burst will know what quality of decoding is applied to it since it will already have identified the corresponding parameter, following the decoding of the previous burst.

According to requirements, said parameters according to the first or second aspect of the invention can either undergo the same channel coding as the associated data or undergo a different channel coding, or undergo no channel coding at all.

It may be advantageous, notably in cases where it is predicted that the quality of the transmission may degrade progressively between the start and end of the transmission, to transmit firstly the values of parameters corresponding to all the blocks of data in the same message and secondly these blocks of data; in addition, this embodiment is compatible with the use of decoders not provided for implementing the invention, which could thus decode the blocks of data in a conventional fashion, after having purely and simply ignored the signal containing the parameters according to the invention.

According to a third of its aspects, the invention concerns various devices.

It thus concerns, firstly, a device for processing blocks of data intended to be transmitted by means of a method according to the first and/or second aspect of the invention, said device being remarkable in that it has:

means for obtaining said parameter, and means for creating a link between this parameter and the associated block of data with a view to the transmission of this parameter and this block of data.

Correlatively, the invention concerns, secondly, a device for assisting with the decoding of blocks of data which have been transmitted by means of a method according to the first and/or second aspect of the invention, said device being remarkable in that it has:

means for extracting said parameter from the signal containing it, and means for, on the basis of said parameter, assisting a decoder responsible for decoding said blocks of data.

The invention concerns, thirdly, a device for coding blocks of data, characterised in that it has:

at least one device for processing blocks of data as described succinctly above, and at least one channel coder.

Correlatively, the invention concerns, fourthly, a device for decoding blocks of data, said device being remarkable in that it has:

at least one channel decoder, and at least one device for assisting with decoding as described succinctly above.

The present invention also relates to:

an apparatus for sending coded digital signals, including a coding device according to the invention, and having means for transmitting said blocks of coded data and said parameters, an apparatus for receiving coded digital signals, including a decoding device according to the invention, and having means for receiving said blocks of coded data and said parameters, a telecommunications network, including at least one transmission apparatus or one digital signal processing apparatus according to the invention, a data storage means which can be read by a computer or microprocessor storing instructions of a computer program, making it possible to implement one of the methods succinctly disclosed above, a data storage means which is removable, partially or totally, and which can be read by a computer and/or microprocessor storing instructions of a computer program, making it possible to implement one of the methods succinctly described above, and a computer program, containing instructions such that, when said program controls a programmable data processing device, said instruction means that said data processing device implements one of the methods succinctly disclosed above.

The advantages offered by these devices, digital signal processing appliances, telecommunications networks, data storage means and computer programs are essentially the same as those offered by the methods according to the invention.

Other aspects and advantages of the invention will emerge from a reading of the following detailed description of particular embodiments, given by way of non-limitative examples. The description refers to the drawings which accompany it, in which.

Figure 3A:
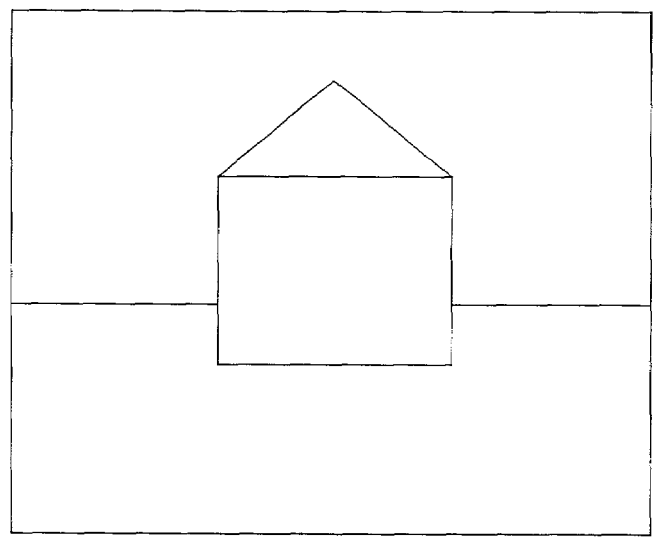
Figure 3B:
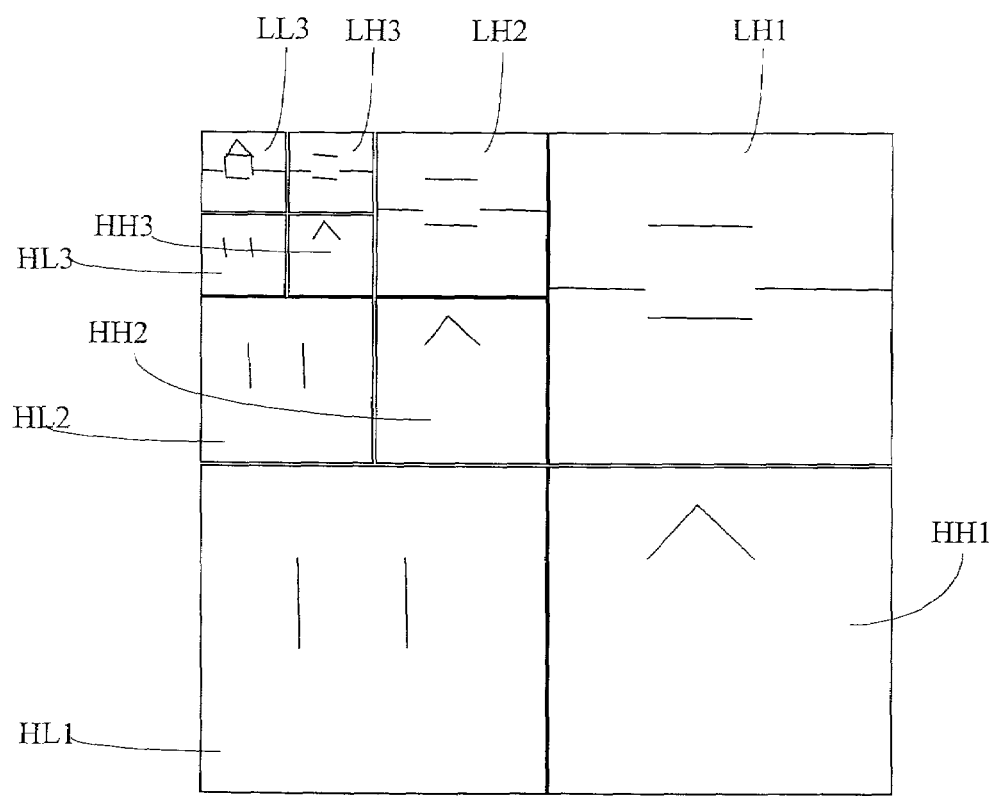
Figure 4:
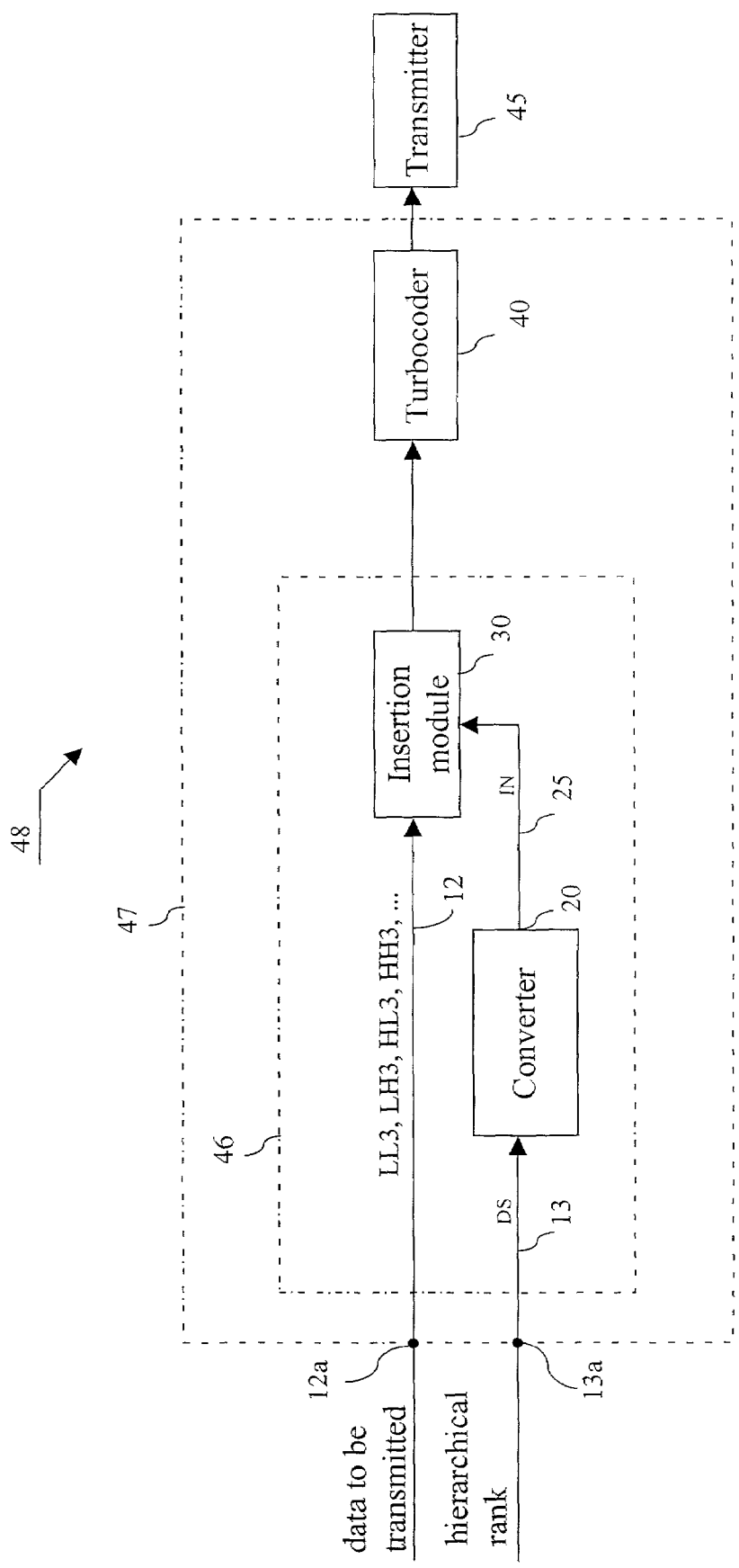
Figure 6A:
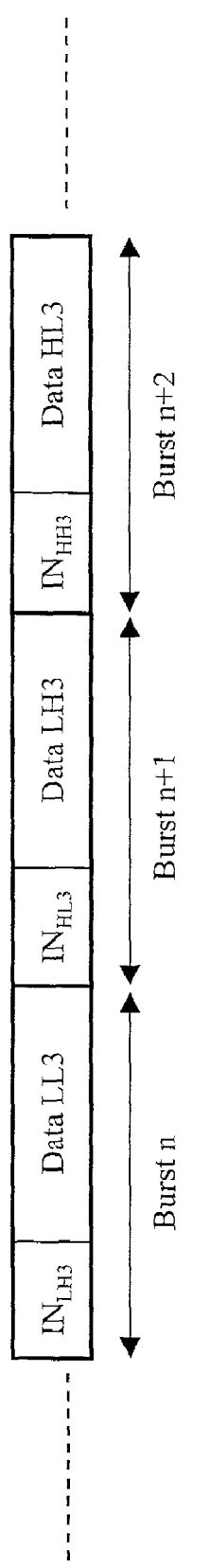
Figure 6B:
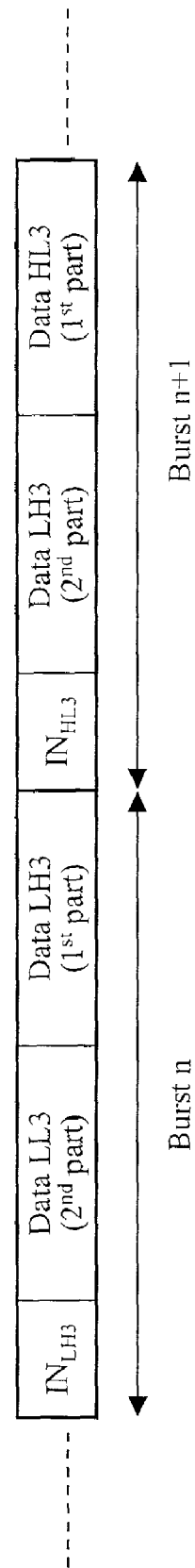
Figure 7:
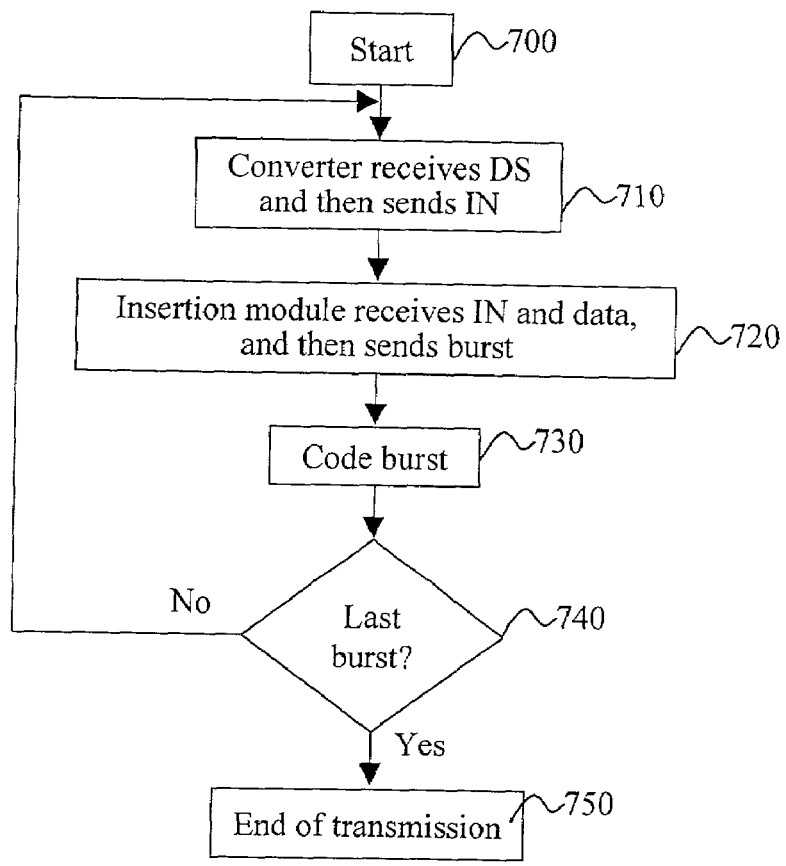
Figure 12:
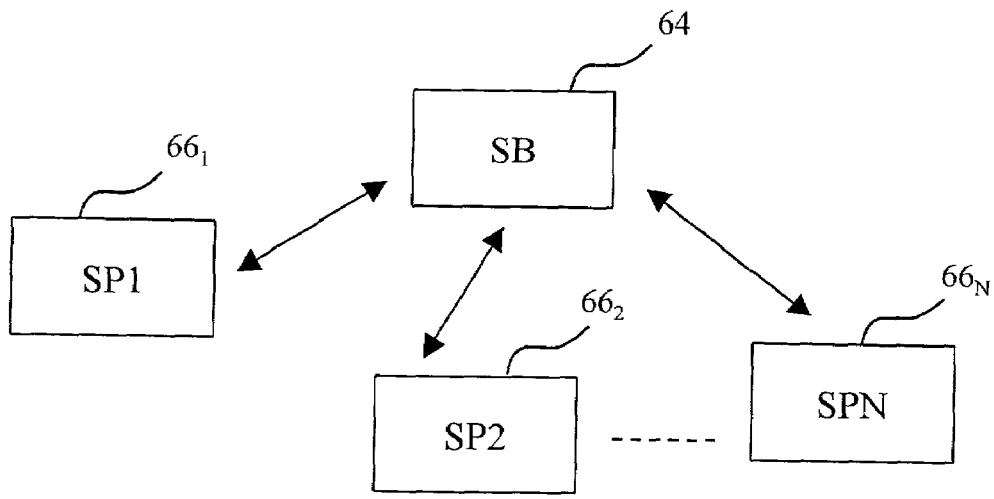
Figure 8:
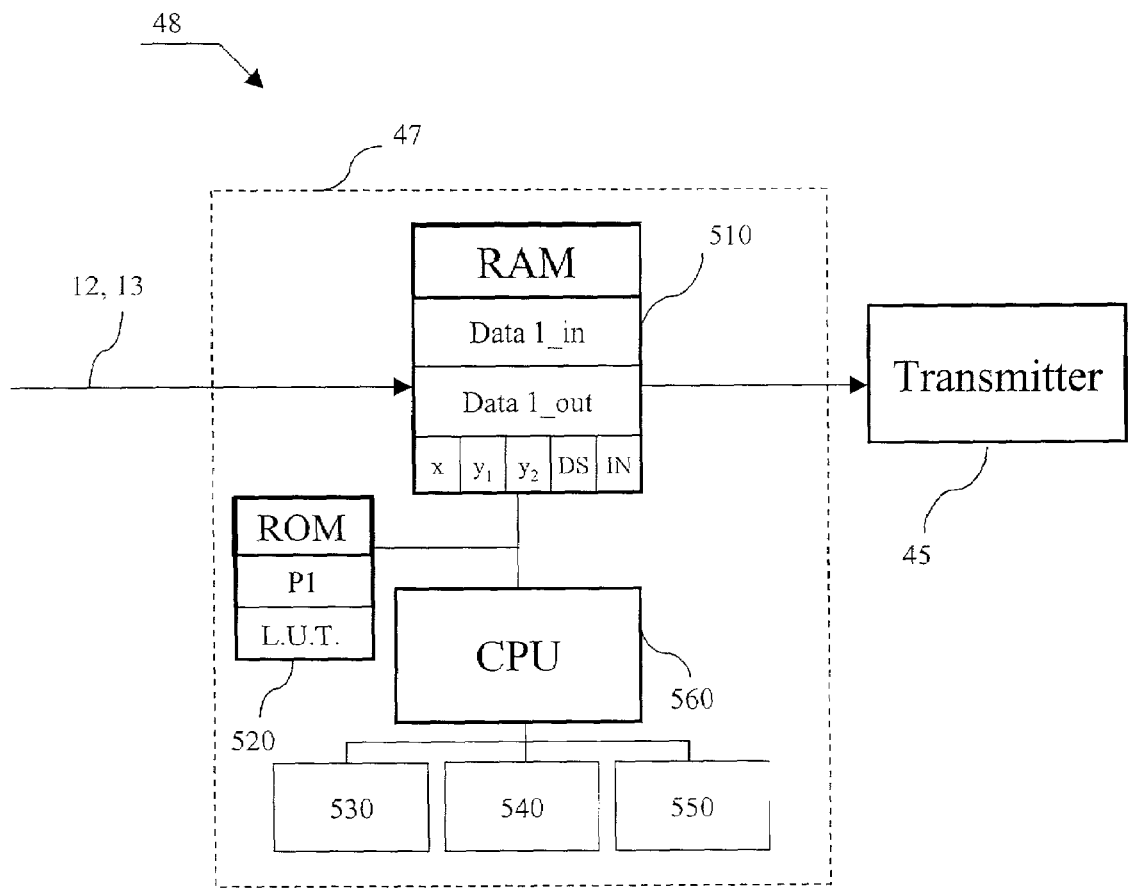
Figure 9:
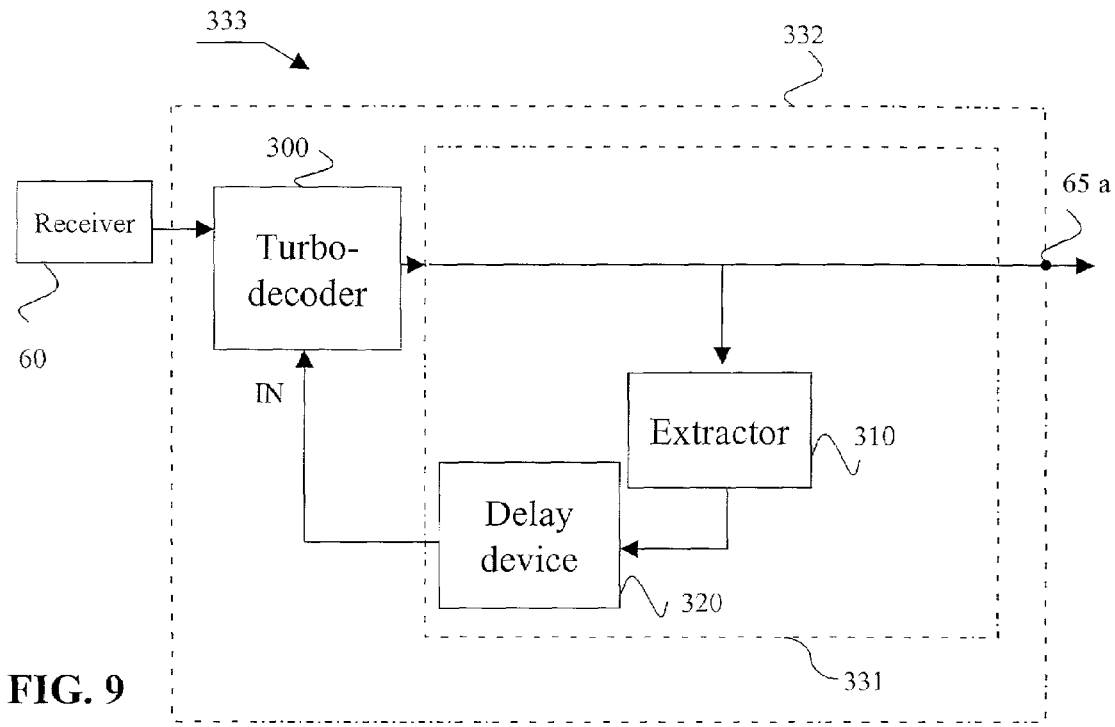
Figure 10:
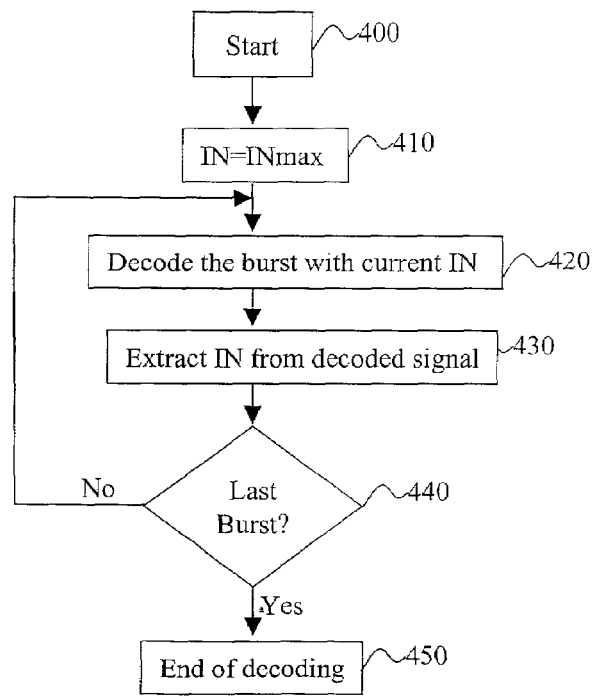
Figure 11:
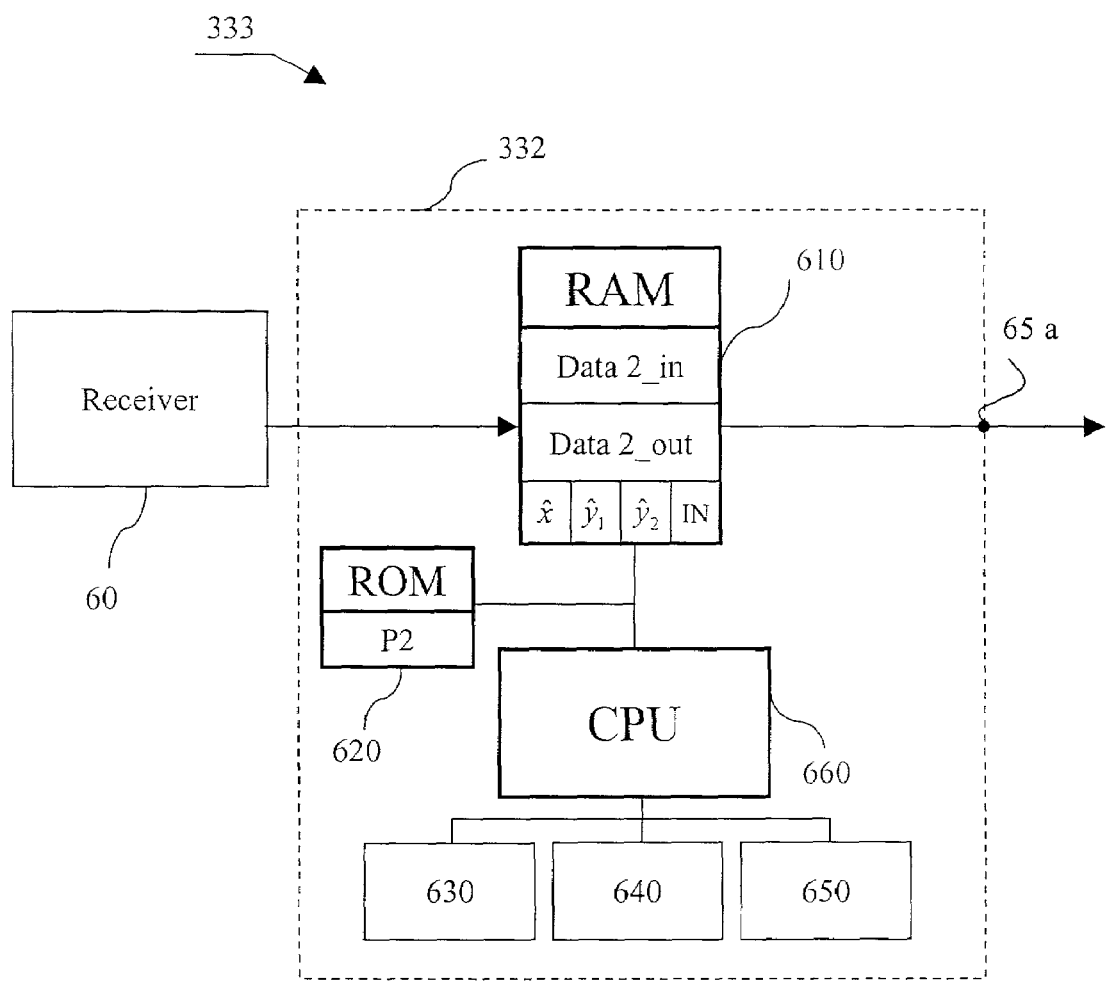

FIGS. 3a and 3b illustrate the general principle of coding by decomposition into sub-bands by means of a simple example of an image to be transmitted, FIG. 4 is a block diagram of an apparatus for sending digital signals coded according to the invention using a turbocoder, FIG. 5a shows a first embodiment of the module 20 of FIG. 4, FIG. 5b shows a second embodiment of the module 20 of FIG. 4, FIG. 6a shows a first embodiment of the content of the signal coming out of the insertion module 30 in FIG. 4, FIG. 6b shows a second embodiment of the content of the signal coming out of the insertion module 30 in FIG. 4, FIG. 7 is a flow diagram representing the main successive steps of the coding method implemented by the apparatus of FIG. 4, FIG. 8 shows a preferred embodiment of the apparatus of FIG. 4, FIG. 9 is a block diagram of an apparatus for receiving coded digital signals according to the invention using a turbodecoder FIG. 10 is a flow diagram representing the main successive steps of the decoding method implemented by the apparatus of FIG. 9, FIG. 11 shows a preferred embodiment of the apparatus of FIG. 9, and FIG. 12 depicts schematically a wireless telecommunication network able to implement the invention.

TECHNOLOGICAL BACKGROUND TO THE PREFERRED EMBODIMENT

The preferred embodiment of the invention presented above by way of example has the following characteristics:

a) the coding of the data for the purpose of transmission is effected by a turbocoder consisting of two convolutional coders and one interleaver (two-parity system), and b) decoding after reception is effected by a turbodecoder consisting of two decoders (for example of the "BJCR" type or of the "SOVA" type, two interleavers, one deinterleaver, one adder and one decision unit.

Figure 1:
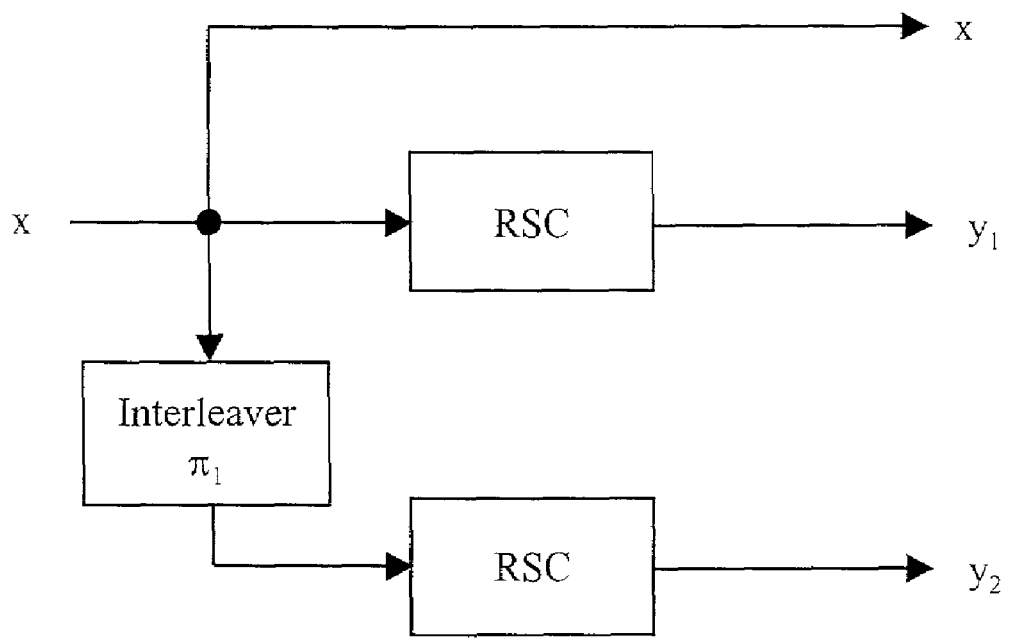
FIG. 1 depicts schematically the structure of a conventional turbocoder.

It will be recalled that a conventional turbocoder consists of two recursive systematic convolutional (RSC) coders and one interleaver, arranged as shown in FIG. 1. The turbocoder supplies as an output three series of binary elements (x, $y_1$, $y_2$), where x is the so-called systematic output of the turbocoder, that is to say one which has undergone no processing compared with the input signal, $y_1$ is the output coded by the first RSC coder, and $y_2$ is the output coded by the second RSC coder after passing through the interleaver $\pi_1$.

Figure 2:
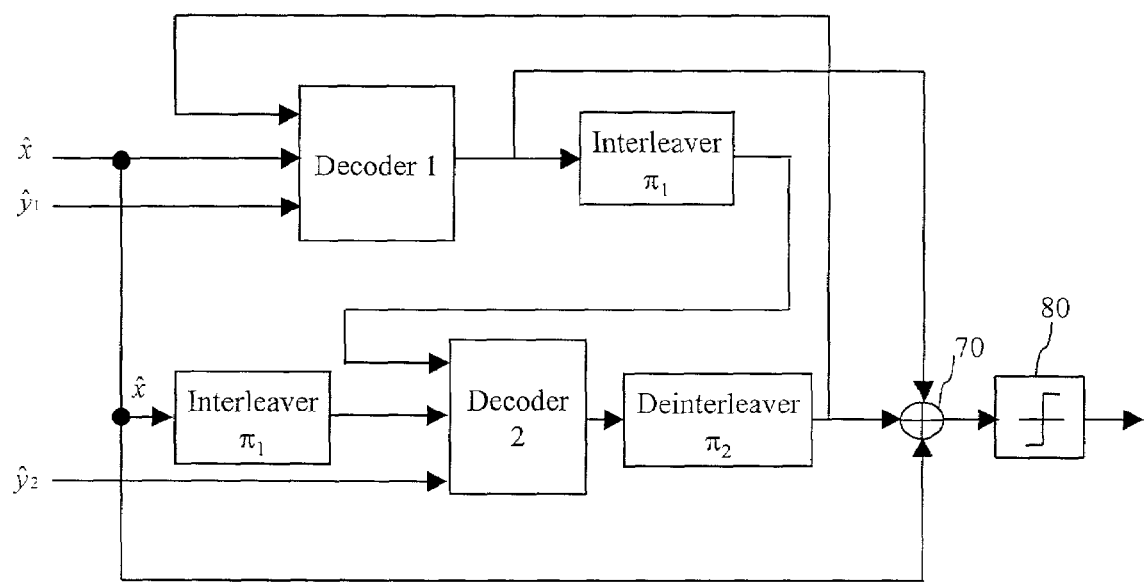
FIG. 2 depicts schematically the structure of a conventional turbodecoder.

FIG. 2 depicts an example of a conventional turbodecoder able to decode data supplied by a turbocoder like the one in FIG. 1. The inputs $\hat{x}$, $\hat{y}_1$, $\hat{y}_2$ of the turbodecoder are the outputs of the turbocoder as received by the decoder after passing through the transmission channel. Such a turbodecoder requires in particular two decoders, designated "decoder 1" and "decoder 2" in FIG. 2, for example of the BCJR type, that is to say using the algorithm of Bahl, Cocke, Jelinek and Raviv, or of the SOVA type (in English: "Soft Output Viterbi Algorithm").

A conventional turbodecoder also requires looping back of the output of the deinterleaver $\pi_2$ onto the input of the first decoder in order to transmit the so-called "extrinsic" information from the second decoder to the first decoder, and an adder 70 and a decision unit 80.

For more details on turbocodes, reference can usefully be made to the article by C. BERROU, A. GLAVIEUX and P. THITIMAJSHIMA entitled "Near Shannon Limit Error-Correcting Coding and Decoding: Turbo-Codes", ICC '93, Geneva (published by IEEE, Piscataway, N.J., USA, 1993), or to the article by R. DE GAUDENZI and M. LUISE entitled "Audio and Video Digital Radio Broadcasting Systems and Techniques", pages 215 to 226 of the Proceedings of the Tirrenia Sixth International Seminar on Digital Telecommunications (1993).

In the preferred embodiments of the invention described below, the data result from the processing of images by the so-called "decomposition into sub-bands" method.

It should be stated that the "decomposition into sub-bands" method or source coding "by decomposition into sub-bands" consists of dividing each image to be transmitted into several hierarchical blocks of data (referred to as "sub-bands"), and this iteratively. For example, at the first iteration, four sub-bands are created: the first contains the low frequencies of the image, the second the horizontal high frequencies, the third the vertical high frequencies and the fourth the diagonal high frequencies. Each sub-band contains a quarter of the data (pixels) of the original image. At the second iteration, the low frequency sub-band is itself decomposed into four new blocks containing the low frequencies, the horizontal high frequencies, the vertical high frequencies and the diagonal frequencies relating to this sub-band. The decomposition process is thus continued a certain number of times according to requirements.

This method is illustrated here by way of example by the decomposition into ten sub-bands (corresponding to three resolution levels) of the image depicted in FIG. 3a. The result is illustrated in FIG. 3b. The level of lowest resolution (top left-hand corner in FIG. 3b) contains the sub-bands LL3, HL3, LH3 and HH3; the second resolution contains the sub-bands HL2, LH2 and HH2; the highest resolution level contains the sub-bands HL1 (vertical high frequencies), LH1 (horizontal high frequencies) and HH1 (diagonal high frequencies). It should be noted that the sub-band LL3 is merely a reduction of the original image, whilst the other sub-bands identify details of this image.

The advantage of this coding by decomposition into sub-bands results from the fact that certain blocks are more important than others with regard to the quality of the image obtained after recomposition. This is because the low frequencies contribute more to the intelligibility of the image than the high frequencies.

The method of decomposition into sub-bands also offers the possibility of allocating to each sub-band a hierarchical rank DS in relation to the importance of these data ("Data Significance"). Thus, in order to exploit this possibility, in a known manner, in the example in question, a value which is all the higher, the lower the hierarchical importance of the corresponding block of data, will be given to DS; more precisely, there will be allocated successively to the sub-band LL3 a value of DS equal to 1, then to the sub-bands LH3, HL3 and HH3 a value of DS equal to 2, then to the sub-bands LH2, HL2 and HH2 a value DS equal to 3, and finally to the sub-bands LH1, HL1 and HH1 a value of DS equal to 4.

This example of the coding by decomposition into sub-bands (used conventionally for apportioning the compression level according to the importance of each block) illustrates the fact, essential for the invention, that there are in practice situations where the data to be transmitted lend themselves naturally to a classification in terms of their importance, which makes it possible, by virtue of the invention, namely by apportioning the quality of the channel decoding to this hierarchy, to make savings with regard to decoding and, thereby, with regard to the entire data coding/transmission/decoding process.

DESCRIPTION OF THE PREFERRED EMBODIMENT

FIG. 4 shows, highly schematically, a digital signal transmission apparatus 48 according to the invention. The latter comprises a transmitter 45 and a coding device 47. In this embodiment, the coding device 47 has on the one hand a turbocoder 40 and on the other hand, in accordance with the invention, a device for processing blocks of data 46. These data come, in this embodiment, from an image processing unit (not shown) decomposing the images to be transmitted into sub-bands and allocating to each sub-band a hierarchical rank DS, as explained above.

The data coming from this image processing unit are introduced into the apparatus through an input for data to be transmitted 12a, whilst the information of hierarchical rank DS is introduced into the apparatus through a hierarchical rank input 13a.

In the preferred embodiment, the hierarchical rank DS is introduced, through a link 13, into a converter 20 which transforms it into a parameter IN which, according to the invention, will serve as an indicator to the iterative decoder (see module 300 in FIG. 7) in order to determine the number of iterations (the "Iteration Number") to be applied to the associated block (LL3, LH3, HL3, HH3, . . . ) as explained below with reference to FIGS. 7 and 8.

The converter 20 consists here of a memory loaded with a look-up table (LUT) (see FIGS. 5a and 5b), which can be produced in software form or in the form of a specific logic circuit.

It should be noted that the parameter IN can either be this number of iterations proper, or the bijective function, known to the decoder, of this number of iterations; in the examples considered below, IN is an increasing function of the number of iterations.

In the preferred embodiment, the signal conveying these parameters IN and the signal conveying the blocks of data (LL3, LH3, HL3, HH3, . . . ) supply, through links 25 and 12 (respectively), an insertion module 30. This module 30 is responsible for associating the content of these two signals in a certain chosen manner; the resulting signal then enters the turbocoder 40, which codes the data of this signal before sending the blocks of data thus obtained to the transmitter 45.

A conversion of an item of information of the DS type into an item of information of the IN type within the converter 20 can be arranged in various ways according to the requirements and the acceptable level of complexity.

The table in FIG. 5a shows an example of a particularly simple embodiment of this conversion, in which the value of IN is a function only of the value of DS. Naturally, IN varies inversely as DS.

It should be noted that here, as a variant, it would be possible to transmit DS rather than IN (the coder obviously being arranged accordingly), in which case it will be DS itself which will fulfil the role of parameter within the meaning of the invention; in addition, in this same case, the converter 20 in the apparatus depicted in FIG. 4 will be omitted, the means of obtaining said parameter then being reduced to the hierarchical rank input 13a.

The table in FIG. 5b shows an example of a more elaborate embodiment, in which the values of IN indicated in the table depend not only on DS but also on the signal to noise ratio SNR anticipated for the transmission of the corresponding data block. Naturally, for a constant DS, the noisier the channel (low SNR) the higher the number of iterations must be to obtain an acceptable bit error rate.

FIGS. 6a and 6b are two examples of a possible structure for the outgoing signal of the insertion module 30 of FIG. 4. This output signal, in these examples, consists of a series of bursts, each burst n containing the value of IN attached to a sub-band contained, wholly or partially, in the following burst (n+1). In the case of FIG. 6a, it has been possible to exactly accommodate one sub-band per burst. In the case of FIG. 6b, two partial sub-bands per burst are transmitted. Each burst (n+1) thus comprises on the one hand the second part of a sub-band with which there is associated the value of IN contained in the burst n, and on the other hand a first part of the following sub-band, of lesser importance, which thereby benefits from the decoding of a higher number of iterations than necessary.

Thus, for the embodiments in FIGS. 6a and 6b, the module 30 fulfils a function known as "insertion", consisting of putting end to end the information received on two distinct channels in accordance with a fixed synchronisation process. This module 30 can be produced in the form of software governing a memory, or in the form of a specific logic circuit.

FIG. 7 is a flow diagram representing the main successive steps of the coding method implemented by the apparatus illustrated in FIG. 4.

After a start-up step 700, the converter 20 receives, at step 710, the information of hierarchical rank DS coming from the input 13a, and converts them into parameter values IN. These values of IN are, at step 720, received by the insertion module 30, which also receives, at another input, the data to be transmitted, and the insertion module 30 associates the two types of information as described above. The bursts thus formed are, at step 730, transmitted to the turbocoder 40, which processes them with a view to transmission by the transmitter 45. At step 740, it is determined whether the burst which has just been processed was the last in the message: if such is the case, the process ends at step 750; otherwise the following burst is prepared, resuming the process at step 710.

The block diagram in FIG. 8 depicts a preferred embodiment of the apparatus illustrated in FIG. 4. This apparatus 48 is associated, in this embodiment, with an image processing unit (not shown).

The turbocoder 40 and the data block processing device 46 are here implemented by a logic unit associated with storage means and peripheral appliances. The coding device 47 thus comprises a calculation unit CPU ("central processing unit") 560, a temporary data storage means 510 (RAM memory), a data storage means 520 (ROM memory), character entry means 530, such as a keyboard for example, image display means 540, such as a screen for example, and input/output means 550.

The RAM memory 510 contains notably:
a memory "data1_in" in which the input data supplied by the image processing unit are temporarily stored,
a memory area "DS" in which the values of DS supplied by the image processing unit are temporarily stored, a memory area "IN" in which the values of IN supplied by the look-up table described with reference to FIG. 5b (in the preferred embodiment) are temporarily stored, memory areas "x", "y$_1$", and "y$_2$" in which the series of bits x, y$_1$, y$_2$ supplied by the turbocoder 40 are temporarily stored, and a memory area "data1_out" in which the output data obtained at the end of the coding method according to the invention are temporarily stored.

The ROM memory 520 contains:

a memory area "P1" in which there is recorded a program implementing a coding method according to the invention, and a memory area "LUT" in which the look-up table mentioned above is recorded.

FIG. 9 shows, highly schematically, a digital signal reception apparatus 333 according to the invention. The latter comprises a receiver 60 and a decoding device 332. In this embodiment, the decoding device 332 has, on the one hand, a turbodecoder 300 and on the other hand, according to the invention, a device for assisting with decoding 331. The turbodecoder 300 receives on the one hand coded data coming from the receiver 60 and on the other hand the corresponding successive values of IN coming from a delay device 320 responsible for storing each value of IN whilst awaiting the arrival of the corresponding burst. The decoding product effected by the turbodecoder 300 is examined by a module 310 responsible for extracting therefrom the value of IN necessary for decoding the data contained in the following burst. The remainder of the signal coming out of the decoder 300, which contains the data of the message proper (that is to say, in this embodiment, the sub-bands), ends up at an interface 65a connected to a unit (not shown) here responsible for reconstructing the initial image from these sub-bands.

FIG. 10 is a flow diagram representing the successive main steps of the decoding method implemented by the apparatus illustrated in FIG. 9.

After the starting up 400 of the decoding of a new message, the turbocoder 300, at step 410, is supplied with an initial value INmax of IN chosen in advance, sufficiently great to ensure a decoding of the first burst with sufficient quality in all circumstances. At step 420, the decoder 300 effects the decoding whilst being guided by the last value of IN supplied by the delay device 320. The product of this decoding is examined at step 430 by the module 310, which extracts therefrom the value of IN necessary for decoding the data contained in the following burst.

Moreover, at step 440 it is determined whether the burst received was the last burst in the message. If such is the case, the decoding ends at step 450; otherwise there is a wait until the receiver 60 receives the following burst, and the process is resumed at step 420 using the value of IN issuing from the delay device 320.

The block diagram in FIG. 11 shows a preferred embodiment of the apparatus illustrated in FIG. 9. This apparatus 333 is associated, in this embodiment, with an image reconstruction unit (not shown).

The turbodecoder 300 and the device assisting with decoding 331 are here implemented by a logic unit associated with a storage means and peripheral appliances. The decoding device 332 thus comprises a calculation unit CPU 660, a temporary data storage means 610 (RAM memory), a data storage means 620 (ROM memory), character entry means 630, image display means 640 and input/output means 650.

The RAM memory 610 contains notably:

a memory area "data2_in" in which the input data supplied by the receiver 60 are temporarily stored, a memory area "IN" in which the values of IN guiding the decoding are temporarily stored, the memory areas "$\hat{x}$", "$\hat{y}_1$", "$\hat{y}_2$" in which the values $\hat{x}$, $\hat{y}_1$, $\hat{y}_2$ corresponding to the series of bits x, y$_1$, y$_2$ provided by the turbocoder supplying the transmitter are temporarily stored, and a memory area "data2_out" in which the output data obtained at the end of a decoding method according to the invention are temporarily stored.

The ROM memory 620 contains a memory area "P2" in which a program implementing a decoding method according to the invention is recorded.

It should be noted that, in certain applications, it would be convenient to use the same computer device (functioning in multi-task mode) for the transmission and reception of signals according to the invention; in this case, the units 47 and 332 will be physically identical.

The methods according to the invention can be implemented within a telecommunication network, as shown in FIG. 12. The network depicted, which can for example consist of one of the future communication networks such as UMTS networks, includes a so-called "base station" SB, designated by the reference 64, and several "peripheral" stations SPi (i=1, . . . , N, where N is an integer greater than or equal to 1), respectively designated by the references 66$_1$, 66$_2$, . . . , 66$_N$. The peripheral stations 66$_1$, 66$_2$, . . . , 66$_N$ are remote from the base station SB, each connected by a radio link with the base station SB and able to move with respect to the latter.

The base station SB and each peripheral station SPi can comprise a data processing unit 560 as described with reference to FIG. 8, a transmission unit and a radio module provided with a conventional transmitter including one or more modulators, filters and an antenna.

The base station SB and each peripheral station SPi according to the invention can also comprise a data processing unit 660 as described with reference to FIG. 11, a reception unit and a radio module with its antenna.

The base station SB and peripheral stations SPi can also comprise, according to requirements, a digital camera, a computer, a printer, a server, a facsimile machine, a scanner or a digital photographic apparatus.

OTHER EMBODIMENTS

The present invention is not limited to the embodiments described above: in fact, a person skilled in the art will be able to implement various variants of the invention whilst remaining within the scope of the accompanying claims.

Notably, the invention according to its first aspect applies, in addition to turbocoding, to any other method also using an interative decoder.

In general terms, for these iterative methods, instead of transmitting the successive values of IN as described above, it is possible, in an equivalent manner, to successively transmit the variations of IN, it being understood that the initial value of IN is known to the decoder in advance. Likewise, the value of IN transmitted may, instead of definitive values, be minimum values, the decoder deciding on the actual values according to additional criteria which will be chosen according to requirements.

In addition, it is very possible to advantageously combine the methods according to the invention with the "adaptive on reception" iterative decoding algorithms mentioned in the introduction, IN then serving as a guide for the decoder, amongst other criteria (for example the entropy of the signal received), in order to determine the required number of iterations.

It should be noted that the invention also applies, according to its second aspect, to non-iterative channel decoding methods in which there exists an adjustable factor controlling the decoding quality. According to the invention, the value of this factor for a corresponding block of data will (wholly or partially) be determined by the relative importance of this block of data within the whole of the message, this importance being expressed by the parameter according to the invention transmitted in association with said block of data.

Concerning the implementation of the invention in a telecommunications network, it should be noted that it may be a case either of a distributed architecture network or a centralised architecture network.

Finally, it is clear that the applications of the invention are in no way limited to the transmission of data representing images. In addition, even for the latter, it is perfectly possible to use a coding source other than coding by decomposition into sub-bands, for example a "coding by regions of interest" as defined by the standard JPEG-2000.

What is claimed is:

1. Method of transmitting blocks of data, in which, for at least one of the blocks of data, at least one parameter associated with the at least one block of data is transmitted, the parameter representing the relative importance of the block of data associated with the parameter within a message transmitted by all the blocks of data, and in which the data is coded by a channel coding method which does not take into account the parameter.

2. Method of decoding blocks of data, for which a signal containing at least one parameter associated with at least one of the blocks of data has been transmitted, the parameter representing the relative importance of the block of data associated with the parameter within a message transmitted by all the blocks of data, in which the data has been coded by a channel coding method which does not take into account the parameter, comprising the steps of:

extracting the parameter from the signal containing the parameter; and using the parameter as a guide for a decoder so that data judged to be more important than other data may benefit from a channel decoding of higher quality.

3. Method according to claim 2, in which said channel decoding is an iterative decoding.

4. Method according to claim 1 or claim 2, in which the blocks of data are transmitted in order of decreasing importance and, where the parameter associated with a block of data newly received has not been able to be decoded correctly, a parameter identical to the parameter associated with a previous block of data is allocated to the new block of data.

5. Method according to claim 1 or claim 2, in which, for said transmission, a signal comprising bursts of bits is transmitted, each burst containing one or more of the blocks of data either complete or fragmented over several successive bursts, and the parameter associated with the most important data appearing in a following burst.

6. Method of transmitting blocks of data which have been coded by a channel coding method compatible with an iterative decoding, in which, for at least one of the blocks of data, at least one parameter associated with the at least one block of data is transmitted, the parameter indicating a minimum number of iterations to be applied by an iterative decoder during the decoding of the block of data associated with the parameter.

7. Method of decoding blocks of data which have been coded by a channel coding method compatible with an iterative decoding, in which a signal containing at least one parameter associated with a block of data has been transmitted for at least one of the blocks of data, comprising the steps of:

extracting the parameter from the signal containing the parameter; and using the parameter as an indicator of a minimum number of iterations applied by the iterative decoder to the block of data associated with the parameter.

8. Method according to claim 6 or claim 7, in which a value of the parameter is the same for all the blocks of data forming part of the same message.

9. Method according to any one of claim 1, 2, 6, or 7, in which the parameter is transmitted over the same channel as the associated data.

10. Method according to any one of claim 1, 2, 6, or 7, in which the parameter and the associated data are transmitted over separate channels.

11. Method according to any one of claim 1, 2, 6, or 7, in which the parameter undergoes the same channel coding as the associated data.

12. Method according to any one of claim 1, 2, 6, or 7, in which the parameter undergoes no channel coding, or undergoes a channel coding different from the channel coding undergone by the associated data.

13. Method according to any one of claim 1, 2, 6, or 7, in which there are transmitted firstly values of parameters corresponding to all the blocks of data in the same message and secondly the blocks of data.

14. Data storage means which can be read by a computer or microprocessor storing instructions of a computer program that is executable to perform a method according to any one of claim 1, 2, 6, or 7.

15. Data storage means which is removable, partially or totally, and which can be read by a computer and/or microprocessor storing instructions of a computer program that is executable to perform a method according to any one of claim 1, 2, 6, or 7.

16. Computer program, containing instructions such that, when said program controls a programmable data processing device, said instructions cause said data processing device to perform a method according to any one of claim 1, 2, 6, or 7.

17. Device for processing blocks of data intended to be transmitted by means of a method according to claim 1 or claim 6, comprising:

means for obtaining the parameter; and means for creating a link between the parameter and the associated block of data with a view to the transmission of the parameter and the block of data.

18. Device for coding blocks of data, comprising:

at least one device for processing blocks of data according to claim 17; and at least one channel coder.

19. Apparatus for transmitting coded digital signals, comprising a coding device according to claim 18, and means for transmitting the blocks of coded data and the parameters.

20. Telecommunications network, comprising at least one apparatus according to claim 19.

21. Device for assisting with the decoding of blocks of data which have been transmitted by a method according to claim 1 or claim 6, comprising:
- means for extracting the parameter from the signal containing the parameter; and
- means for, on the basis of the parameter, assisting a decoder responsible for decoding the blocks of data.

22. Device for decoding blocks of data, comprising:
- at least one channel decoder; and
- at least one device for assisting with decoding according to claim 21.

23. Apparatus for receiving coded digital signals, comprising a decoding device according to claim 22, and means for receiving the blocks of coded data and the parameters.

* * * * *

UNITED STATES PATENT AND TRADEMARK OFFICE
CERTIFICATE OF CORRECTION

PATENT NO. : 6,996,170 B2
APPLICATION NO. : 09/902757
DATED : February 7, 2006
INVENTOR(S) : François Thoumy et al.

It is certified that error appears in the above-identified patent and that said Letters Patent is hereby corrected as shown below:

ON THE TITLE PAGE ITEM [56] OTHER PUBLICATIONS:

After P.H. Westerink, et al. "vol. 41, No. 3," should read --vol. 41, No. 3,--.

ON THE TITLE PAGE ITEM [75] INVENTORS:

"Isabelle Amonou, Thorigne (FR)," should read --Isabelle Amonou, Thorigne-Fouillard (FR)--.

COLUMN 1

Line 6, "which" should read --in which--.

COLUMN 2

Line 52, "coding" and "decoding" should be italized.

COLUMN 3

Line 26, "decoded" should read --be decoded--.

COLUMN 5

Line 25, "turbodecoder" should read --turbodecoder.--.

COLUMN 6

Line 29, "low frequency" should read --low-frequency--.

COLUMN 10

Line 55, "interative" should read --iterative--.

UNITED STATES PATENT AND TRADEMARK OFFICE
CERTIFICATE OF CORRECTION

PATENT NO. : 6,996,170 B2
APPLICATION NO. : 09/902757
DATED : February 7, 2006
INVENTOR(S) : François Thoumy et al.

It is certified that error appears in the above-identified patent and that said Letters Patent is hereby corrected as shown below:

COLUMN 12

Line 19, "claim" should read --claims--;
Line 23, "claim" should read --claims--;
Line 26, "claim" should read --claims--;
Line 29, "claim" should read --claims--;
Line 34, "claim" should read --claims--;
Line 41, "claim" should read --claims--;
Line 46, "claim" should read --claims--; and
Line 50, "claim" should read --claims--.

Signed and Sealed this

Twenty-sixth Day of September, 2006

JON W. DUDAS
*Director of the United States Patent and Trademark Office*